United States Patent
Eldesouki et al.

(10) Patent No.: US 9,099,956 B2
(45) Date of Patent: Aug. 4, 2015

(54) INJECTION LOCKING BASED POWER AMPLIFIER

(75) Inventors: Munir Eldesouki, Hamilton (CA); Mohamed Jamal Deen, Dundas (CA)

(73) Assignee: KING ABDULAZIZ CITY FOR SCIENCE AND TECHNOLOGY, Riyadh (SA)

( * ) Notice: Subject to any disclaimer, the term of this patent is extended or adjusted under 35 U.S.C. 154(b) by 0 days.

(21) Appl. No.: 13/093,867

(22) Filed: Apr. 26, 2011

(65) Prior Publication Data

US 2012/0274409 A1 Nov. 1, 2012

(51) Int. Cl.
| | |
|---|---|
| H03B 5/08 | (2006.01) |
| H03B 5/18 | (2006.01) |
| H03B 5/12 | (2006.01) |
| H03C 1/52 | (2006.01) |
| H03F 3/193 | (2006.01) |

(Continued)

(52) U.S. Cl.
CPC .............. *H03B 5/1228* (2013.01); *H03B 5/1215* (2013.01); *H03B 5/1243* (2013.01); *H03C 1/52* (2013.01); *H03F 3/193* (2013.01); *H03B 5/00* (2013.01); *H03B 19/12* (2013.01); *H03C 2200/0058* (2013.01)

(58) Field of Classification Search
CPC ........ H03B 5/00; H03B 19/12; H03B 5/1228; H03B 5/1215; H03B 5/1243; H03C 1/52; H03C 2200/0058; H03F 3/193
USPC .......... 331/51, 117 R, 117 FE, 167; 327/115, 327/117
See application file for complete search history.

(56) References Cited

U.S. PATENT DOCUMENTS

| 3,304,518 A | 2/1967 | Mackey |
| 3,397,365 A | 8/1968 | Kruse, Jr. et al. |

(Continued)

FOREIGN PATENT DOCUMENTS

| EP | 1770854 A2 | 4/2007 |
| EP | 2214324 B1 | 3/2011 |

(Continued)

OTHER PUBLICATIONS

"A CMOS direct injection-locked oscillator topology as high-frequency low-power frequency divider", IEEE Xplore Journal, Jul. 2004 by M. Tiebout et al. (p. 1) http://ieeexplore.ieee.org/xpl/login.jsp?tp=&arnumber=1308592&url=http%3A%2F%2Fieeexplore.ieee.org%2Fxpls%2Fabs_all.jsp%3Farnumber%3D1308592.

(Continued)

*Primary Examiner* — Arnold Kinkead
*Assistant Examiner* — Richard Tan
(74) *Attorney, Agent, or Firm* — Raj Abhyanker, P.C.

(57) ABSTRACT

A method, an apparatus and/or a system of injection locking based power amplifier is disclosed. A method includes inputting a reference signal through an injection circuit of an oscillator circuit that generates an output signal of high power that oscillates at an inherent frequency of oscillation of the oscillator circuit. The method also includes reducing a frequency of the reference signal through a differential transistor pair coupled to the injection circuit of the oscillator circuit. The method further includes locking through a tuning circuit of the oscillator circuit coupled to the differential transistor pair a frequency of the output signal to the reduced frequency of the reference signal based on the power of the reference signal to amplify the power of the reference signal through the oscillator circuit. The frequency of the reference signal is higher than the frequency of the output signal.

20 Claims, 6 Drawing Sheets

$f_r$ = frequency of the reference signal
$f_o$ = frequency of the output signal
$P_r$ = Power of the reference signal
$P_o$ = Power of the output signal Where, $f_r > f_o$ and $P_r < P_o$

(51) Int. Cl.
*H03B 19/12* (2006.01)
*H03B 5/00* (2006.01)

(56) References Cited

U.S. PATENT DOCUMENTS

| | | | |
|---|---|---|---|
| 3,599,118 A | 8/1971 | Large | |
| 4,003,004 A | 1/1977 | Honnell | |
| 4,074,209 A | 2/1978 | Lysobey | |
| 4,268,759 A | 5/1981 | Gilbert | |
| 4,360,790 A | 11/1982 | Heise | |
| 4,430,627 A | 2/1984 | Machida | |
| 4,527,130 A | 7/1985 | Lutteke | |
| 4,621,241 A | 11/1986 | Kiser | |
| 4,631,497 A | 12/1986 | Braun | |
| 4,730,169 A | 3/1988 | Li | |
| 4,736,454 A | 4/1988 | Hirsch | |
| 5,187,451 A | 2/1993 | Nakamoto et al. | |
| 5,231,361 A | 7/1993 | Smith et al. | |
| 5,265,267 A | 11/1993 | Martin et al. | |
| 5,278,989 A | 1/1994 | Burke et al. | |
| 5,302,918 A | 4/1994 | Sturzebecher et al. | |
| 5,495,208 A | 2/1996 | Gonzalez et al. | |
| 5,497,123 A | 3/1996 | Main et al. | |
| 5,602,834 A | 2/1997 | Dean | |
| 5,629,652 A | 5/1997 | Weiss | |
| 5,748,051 A | 5/1998 | Lewis | |
| 5,856,763 A | 1/1999 | Reeser et al. | |
| 5,920,235 A | 7/1999 | Beards et al. | |
| 5,940,756 A | 8/1999 | Sibecas et al. | |
| 5,945,878 A | 8/1999 | Westwick et al. | |
| 6,038,445 A | 3/2000 | Alperovich et al. | |
| 6,046,647 A | 4/2000 | Nelson | |
| 6,052,036 A | 4/2000 | Enstrom et al. | |
| 6,057,714 A | 5/2000 | Andrys et al. | |
| 6,064,277 A | 5/2000 | Gilbert | |
| 6,133,793 A | 10/2000 | Lau et al. | |
| 6,175,285 B1 | 1/2001 | Gabara | |
| 6,188,291 B1 | 2/2001 | Gopinathan et al. | |
| 6,230,017 B1 | 5/2001 | Andersson et al. | |
| 6,292,065 B1 | 9/2001 | Friedman et al. | |
| 6,307,439 B2 | 10/2001 | Cunning | |
| 6,559,723 B2 | 5/2003 | Hollenbeck et al. | |
| 6,564,066 B1 | 5/2003 | Biggs et al. | |
| 6,680,655 B2 | 1/2004 | Rogers | |
| 6,693,493 B2 | 2/2004 | Kim et al. | |
| 6,750,726 B1 | 6/2004 | Hung et al. | |
| 6,765,448 B2 | 7/2004 | Wu et al. | |
| 6,784,753 B2 * | 8/2004 | Leenaerts et al. | 331/36 C |
| 6,812,802 B1 | 11/2004 | Godambe et al. | |
| 6,825,736 B1 | 11/2004 | Kehler et al. | |
| 6,838,952 B2 | 1/2005 | Ramet | |
| 6,867,656 B2 * | 3/2005 | Hajimiri et al. | 331/45 |
| 6,867,658 B1 | 3/2005 | Sibrai et al. | |
| 6,909,336 B1 | 6/2005 | Rajagopalan et al. | |
| 7,010,305 B2 | 3/2006 | Immonen et al. | |
| 7,026,883 B2 | 4/2006 | Muthali et al. | |
| 7,038,552 B2 | 5/2006 | Brett et al. | |
| 7,064,622 B2 | 6/2006 | Jasa et al. | |
| 7,132,901 B2 | 11/2006 | Cojocaru | |
| 7,138,879 B2 | 11/2006 | Su | |
| 7,161,442 B2 | 1/2007 | Hong et al. | |
| 7,161,914 B2 | 1/2007 | Shoaib et al. | |
| 7,199,675 B2 | 4/2007 | Lee et al. | |
| 7,256,660 B2 | 8/2007 | Gelhausen et al. | |
| 7,301,412 B2 | 11/2007 | Moribe et al. | |
| 7,301,414 B2 | 11/2007 | Hino | |
| 7,348,818 B2 * | 3/2008 | Hulfachor et al. | 327/156 |
| 7,365,612 B2 | 4/2008 | Rohde et al. | |
| 7,382,206 B2 | 6/2008 | Park et al. | |
| 7,394,786 B2 | 7/2008 | Virtanen | |
| 7,548,751 B2 | 6/2009 | Katori et al. | |
| 7,557,664 B1 * | 7/2009 | Wu | 331/51 |
| 7,603,244 B2 | 10/2009 | Wang et al. | |
| 7,606,914 B2 | 10/2009 | Ikeda et al. | |
| 7,643,411 B2 | 1/2010 | Andreasen et al. | |
| 7,688,153 B2 | 3/2010 | Jacobsson et al. | |
| 7,696,834 B2 | 4/2010 | Sung | |
| 7,728,679 B2 | 6/2010 | Wang et al. | |
| 7,737,797 B2 | 6/2010 | Shen | |
| 7,886,239 B2 * | 2/2011 | Chang et al. | 716/108 |
| 7,915,966 B2 | 3/2011 | Tokuyama | |
| 7,916,691 B2 | 3/2011 | Kopplin | |
| 7,917,120 B1 | 3/2011 | Gilbert | |
| 7,936,224 B2 | 5/2011 | Zhan | |
| 7,940,132 B2 | 5/2011 | May et al. | |
| 7,961,058 B2 * | 6/2011 | Luong et al. | 331/74 |
| 8,009,675 B2 | 8/2011 | Andersson | |
| 8,040,864 B2 | 10/2011 | Karaoguz et al. | |
| 8,076,982 B2 | 12/2011 | Suzuki | |
| 8,134,417 B2 | 3/2012 | Chiang et al. | |
| 8,346,241 B2 | 1/2013 | Behairy et al. | |
| 8,417,237 B2 | 4/2013 | Behairy et al. | |
| 8,660,500 B2 | 2/2014 | Rofougaran et al. | |
| 8,710,937 B1 | 4/2014 | Sutardja | |
| 8,723,609 B2 | 5/2014 | Chang et al. | |
| 8,723,610 B2 | 5/2014 | Cao | |
| 8,736,392 B2 | 5/2014 | Taghivand | |
| 8,811,926 B2 | 8/2014 | Otis et al. | |
| 2002/0084860 A1 | 7/2002 | Festag | |
| 2002/0171498 A1 | 11/2002 | Leenaerts et al. | |
| 2003/0025566 A1 | 2/2003 | Rogers | |
| 2003/0122669 A1 | 7/2003 | Filippov et al. | |
| 2003/0210101 A1 | 11/2003 | McCorquodale et al. | |
| 2004/0100329 A1 | 5/2004 | Kim et al. | |
| 2004/0212443 A1 | 10/2004 | Godambe et al. | |
| 2004/0251971 A1 | 12/2004 | Kehler et al. | |
| 2005/0181773 A1 | 8/2005 | Chang | |
| 2006/0132253 A1 * | 6/2006 | Gelhausen et al. | 331/167 |
| 2007/0001719 A1 | 1/2007 | Hulfachor et al. | |
| 2007/0155421 A1 | 7/2007 | Alberth et al. | |
| 2008/0007335 A1 | 1/2008 | Park et al. | |
| 2008/0169888 A1 * | 7/2008 | Chatwin et al. | 333/24 C |
| 2008/0207217 A1 | 8/2008 | Ramanathan et al. | |
| 2009/0081961 A1 | 3/2009 | Rofougaran | |
| 2009/0231051 A1 | 9/2009 | Tokuyama | |
| 2009/0251228 A1 | 10/2009 | Suzuki | |
| 2010/0124931 A1 | 5/2010 | Eskicioglu et al. | |
| 2010/0265001 A1 * | 10/2010 | Tsuda et al. | 331/36 C |
| 2010/0311379 A1 | 12/2010 | Rofougaran et al. | |
| 2011/0006850 A1 * | 1/2011 | Shibasaki et al. | 331/55 |
| 2011/0050296 A1 | 3/2011 | Fagg | |
| 2012/0038396 A1 | 2/2012 | Shima et al. | |
| 2012/0268222 A1 | 10/2012 | Czimmek | |
| 2013/0328633 A1 | 12/2013 | Zhang et al. | |
| 2014/0266480 A1 | 9/2014 | Li et al. | |

FOREIGN PATENT DOCUMENTS

| | | |
|---|---|---|
| WO | 0217476 A1 | 2/2002 |
| WO | 2004015870 A1 | 2/2004 |
| WO | 2006047041 A1 | 5/2006 |
| WO | 2013085971 A1 | 6/2013 |

OTHER PUBLICATIONS

"A Power-Efficient Injection-Locked Class-E Power Amplifier for Wireless Sensor Network", IEEE Microwave and Wireless Components Letters, vol. 16, No. 4, Apr. 2006, by Hyoung-Seok Oh et al. (pp. 3) http://www.ece.umn.edu/groups/iml/publications/2006/LMWC.2006.872141.pdf.

"A Broadband Injection-Locking Class-E Power Amplifier", IEEE Xplore Journal, Oct. 2012 by Chi-Hsien Lin et al. (pp. 2) http://ieeexplore.ieee.org/xpl/login.jsp?tp=&arnumber=6294471&url=http%3A%2F%2Fieeexplore.ieee.org%2Fiel5%2F22%2F6314489%2F06294471.pdf%3Farnumber%3D6294471.

"A Compact Single Stage V-band CMOS Injection-Locked Power Amplifier with 17.3% Efficiency" by Jiafu Lin et al. (pp. 3) http://www3.ntu.edu.sg/home/eccboon/pub/A%20Compact%20Single%20Stage%20V-band%20CMOS.pdf.

"Oscillator Injection Locking" (pp. 3) http://www.ko4bb.com/~bruce/InjectionLocking.html.

(56) References Cited

OTHER PUBLICATIONS

"Inter-Injection-Locked Oscillators for Power Combining and Phased Arrays", IEEE Xplore Journal, Oct. 1986 by K. D. Stephan (p. 1) http://ieeexplore.ieee.org/xpl/login.jsp?tp=&arnumber=1133491&url=http%3A%2F%2Fieeexplore.ieee.org%2Fxpls%2Fabs_all.jsp%3Farnumber%3D1133491.

\* cited by examiner

| PA CLASS 402 | f (GHz) 404 | P_DC (mW) 406 | P_OUT (dBm) 408 | GAIN (dB) 410 | PAE (%) 412 | AREA (mm²) 414 |
|---|---|---|---|---|---|---|
| AB | 0.402 | --- | -5 | --- | --- | --- |
| C | 0.43 | --- | 4 | --- | 15 | --- |
| AB | 0.43 | 67.3 | 13 | 16.5 | 29 | 0.9 |
| HIGH POWER ILO 100 | 0.43 | 29.4 | 6.3 | 30 | 14.5 | 0.9 |
| AB | 1.92 | 7.2 | 4 | 6 | 26 | --- |
| AB | 2.45 | 12 | 5.4 | 19.5 | 28.5 | 1.0 |
| E | 2.40 | 24.9 | 9.5 | 11 | 33 | 1.1 |
| E-ILO | 2.35 | 27.7 | 11 | 17 | 44.5 | 1.7 |
| AB | 2.45 | 15.2 | 3.5 | 13 | 14 | 0.6 |
| AB | 2.40 | 49 | 9 | 19 | 16 | 1.25 |
| E | 2.00 | 36.2 | 11.8 | 11.7 | 39 | 0.72 |
| AB | 2.4 | 3.47 | -10 | 15 | 2.8 | 1.0 |
| HIGH POWER ILO 100 | 2.40 | 16 | 7.6 | 31 | 36 | 0.6 |

UNLESS STATED, ALL DESIGNS ARE FULLY INTEGRATED USING CMOS 0.18 μm
[A] OFF-CHIP COMPONENTS  [B] CMOS 0.5μm
[C] CMOS 0.13μm  [D] SiGe BiCMOS

PERFORMANCE COMPARISON BETWEEN CMOS POWER AMPLIFIERS 400

FIGURE 4

INJECTION LOCKING BASED POWER AMPLIFIER

FIELD OF THE INVENTION

This disclosure relates generally to a field of analog circuits and, more particularly, to an injection locking based power amplifier.

BACKGROUND

A power amplifier circuit with low output power may imply a large output load. The power amplifier circuit may require large DC-feed inductors to drive the large output loads. The large DC-feed inductors may have a very low quality-factor when implemented on-chip. The power amplifier circuit designed for low power applications may have to use off-chip components, especially for a moderate frequency range (e.g., 433 MHz for the European ISM band and the European 405 MHz medical implantable communication systems (MICS)). However, large inductors may be required for said design using off-chip components. The large inductors may have high losses and thereby reduce an efficiency of the said circuit. The large inductors may also increase the chip area needed to implement the power amplifier circuit.

The power amplifier circuit may achieve increased power efficiency through using a non-linear amplifier. However, the design may require very high quality-factor inductors. Such high quality-factor inductors may not be available in standard CMOS technology. Consequently, a fully integrated power amplifier circuit designed for low power applications (e.g., less than approximately 10 dBm) may have a lower efficiency than a power amplifier circuit designed for high power applications. Also, a non-linear amplifier may require a large input drive to achieve a maximum efficiency. This may limit the gain of the amplifier and may result in a low power-added efficiency.

SUMMARY

Disclosed are a method, an apparatus and/or a system of injection locking based power amplifier.

In one aspect, a method includes inputting a reference signal through an injection circuit of an oscillator circuit that generates an output signal of high power that oscillates at an inherent frequency of oscillation of the oscillator circuit. The power of the output signal is higher than a power of the reference signal. The method also includes reducing a frequency of the reference signal through a differential transistor pair coupled to the injection circuit of the oscillator circuit. The method further includes locking through a tuning circuit of the oscillator circuit coupled to the differential transistor pair a frequency of the output signal to the reduced frequency of the reference signal based on the power of the reference signal to amplify the power of the reference signal through the oscillator circuit. The frequency of the reference signal is higher than the frequency of the output signal.

In another aspect, a system includes a circuit of a previous stage of operation. The system further includes an oscillator circuit coupled to a circuit of a previous stage of operation configured to generate an output signal of high power that oscillates at an inherent frequency of oscillation of the oscillator circuit. The oscillator circuit includes an injection circuit of the oscillator circuit configured to receive a reference signal from the circuit of the previous stage as an input to the injection locked oscillator circuit. The power of the output signal is higher than a power of the reference signal. The oscillator circuit also includes a differential transistor pair coupled to the injection circuit of the oscillator circuit configured to reduce a frequency of the reference signal. The oscillator circuit further includes a tuning circuit of the oscillator circuit coupled to the differential transistor pair configured to lock a frequency of the output signal to the reduced frequency of the reference signal based on the power of the reference signal to amplify the power of the reference signal through the oscillator circuit. The frequency of the reference signal is higher than the frequency of the output signal.

In yet another aspect, a method includes inputting a reference signal through an injection circuit of an oscillator circuit that generates an output signal of high power that oscillates at an inherent frequency of oscillation of the oscillator circuit. The power of the output signal is higher than a power of the reference signal. The method also includes reducing a frequency of the reference signal through a differential transistor pair coupled to the injection circuit of the oscillator circuit. The method further includes locking through a tuning circuit of the oscillator circuit coupled to the differential transistor pair a frequency of the output signal to the reduced frequency of the reference signal based on the power of the reference signal to amplify the power of the reference signal through the oscillator circuit. The frequency of the reference signal is higher than the frequency of the output signal. The method also includes delivering the output signal to a load coupled to an output of the oscillator circuit. The power of the output signal is based on a difference between a power of the output signal and the power of the reference signal required to maintain the locking of the reduced frequency of the reference signal to the frequency of the output signal.

BRIEF DESCRIPTION OF THE FIGURES

Example embodiments are illustrated by way of example and not limitation in the figures of the accompanying drawings, in which like references indicate similar elements and in which:

FIG. 4 is a table view of a performance comparison between the injection locked oscillator circuit of FIG. 1 configured to operate as a power amplifier and various power amplifiers, according to one or more embodiments.

Figure 1:
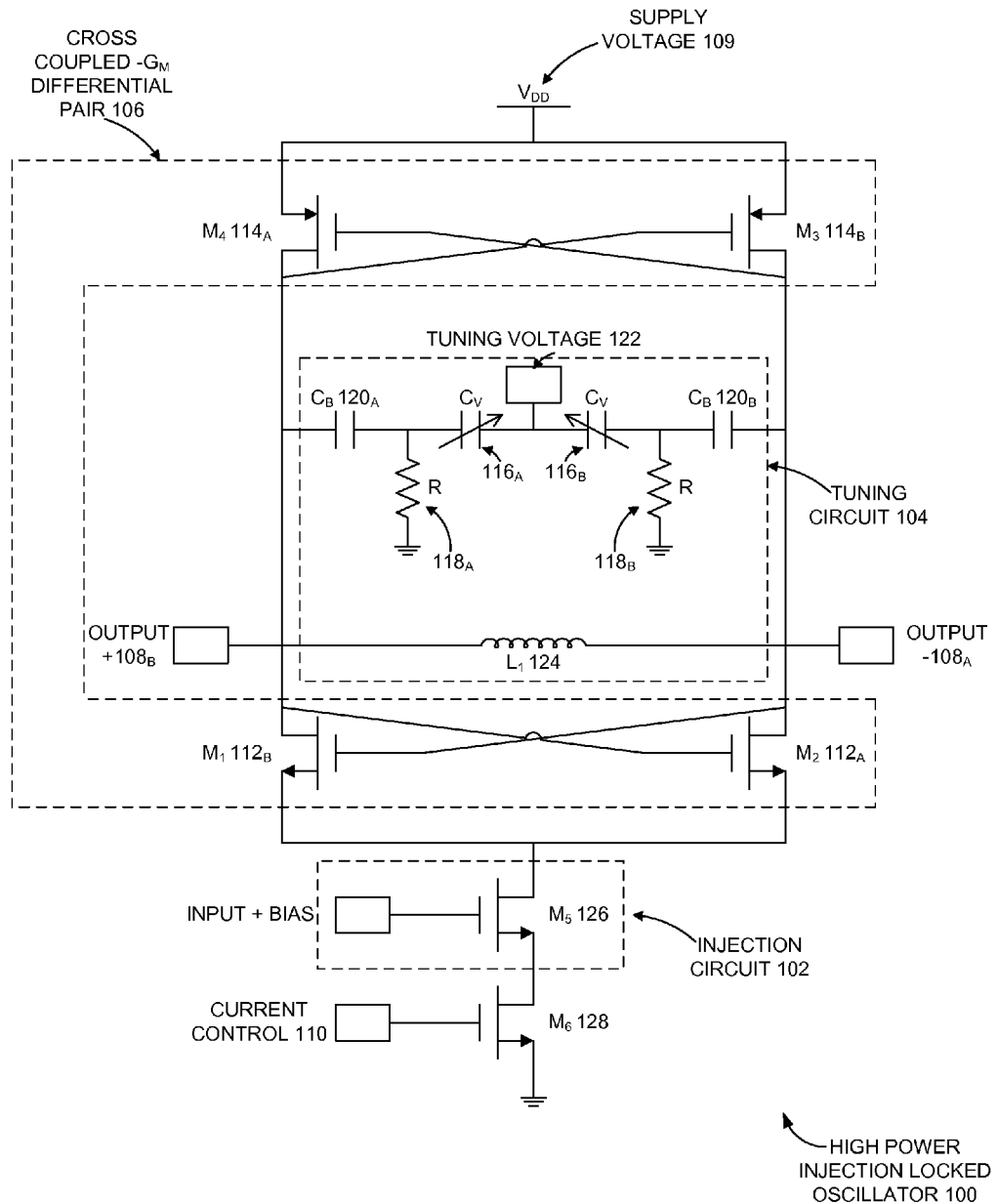
FIG. 1 is a schematic view of the oscillator circuit configured to operate as a power amplifier, according to one or more embodiments.

Other features of the present embodiments will be apparent from the accompanying drawings and from the detailed description that follows.

DETAILED DESCRIPTION

A method, apparatus and system of injection locking based power amplifier is disclosed. Although the present embodiments have been described with reference to specific example embodiments, it will be evident that various modifications and changes may be made to these embodiments without departing from the broader spirit and scope of the various embodiments.

In one or more embodiments, the oscillator circuit may be an injection locked oscillator circuit. The oscillator circuit may be referred to as injection locked oscillator circuit hereafter. In one or more embodiments, the injection locked oscillator circuit may be configured to oscillate at an inherent frequency of oscillation (e.g., free running oscillation frequency). The injection locked oscillator circuit may be a high power oscillator. The injection locked oscillator circuit may generate an output signal of high power even when an input signal (e.g., reference signal) is applied. The frequency of the output signal may be equivalent to the inherent frequency of oscillation of the injection locked oscillator circuit.

In one or more embodiments, a reference signal (e.g., input signal) may be applied to the injection locked oscillator circuit. The reference signal may be received from a circuit of a previous stage (e.g., previous RF stages) coupled to the input of the injection locked oscillator. In some embodiments, the reference signal may be directly received from a signal source. The reference signal may be of a higher frequency (e.g., x2 times) than a desired frequency of the output signal of the injection locked oscillator circuit (e.g., superharmonic injection locked oscillator). The frequency of the reference signal may be higher than the inherent frequency of oscillation of the injection locked oscillator. In one or more embodiments, the power of the reference signal may be lower than the power of the output signal.

In one or more embodiments, the frequency of the reference signal may be reduced by two through the differential transistor pair of the injection locked oscillator circuit. In one or more embodiments, the injection locked oscillator circuit may lock (e.g., injection locking) the inherent frequency of oscillation of the injection locked oscillator circuit to the reduced frequency and/or phase of the reference signal. The reference signal may be amplified through locking the inherent frequency of oscillation of the injection locked oscillator circuit to the reduced frequency of the reference signal.

In one or more embodiments, the output signal may be outputted to a load coupled to an output circuit of the injection locked oscillator circuit. In some embodiments, the output signal delivered to the load may be based on a difference between a power of the output signal and the power of reference signal (e.g., minimum input drive) required to maintain the locking a frequency of the reference signal inputted to the injection locked oscillator circuit to the inherent frequency of oscillation of the injection locked oscillator circuit.

In one or more embodiments, the injection locked oscillator circuit may be a cross-coupled differential negative $g_m$ voltage-controlled-oscillator (VCO). In one or more embodiments, the injection locked oscillator circuit may be configured to operate as an injection locked frequency divider. The injection locked frequency divider based on the injection locked oscillator circuit may be configured to operate as a locking mode power amplifier. An oscillator may lock (e.g., mode locking, injection locking) to a reference signal (e.g., input signal) with sufficient power (e.g., input drive) of the reference signal and/or when the reference signal is within a tuning range of the oscillator. In one or more embodiments, mode-locking may be used for amplifying an input signal (e.g., reference signal).

In one or more embodiments the injection locked oscillator circuit may be a superharmonic injection locked oscillator. Injection locked oscillators (ILOs) are considered harmonic when the input and output frequencies are equal, subharmonic when the output frequency is higher than the input frequency and superharmonic when the output frequency is lower than the input frequency. In one or more embodiments, injection-locking may be used to reduce the input drive and thereby increasing a gain of the circuit. In one or more embodiments, frequency division may be used to realize power amplification by superharmonic injection-locking.

FIG. 1 is a schematic view of the oscillator circuit configured to operate as a power amplifier, according to one or more embodiments. In particular, FIG. 1 illustrates a cross coupled negative $g_m$ differential pair circuit 106, a tuning circuit 104, an injection circuit 102, a positive output $208_a$, a negative output $208_b$, a pair of PMOS transistors (M$_3$-M$_4$) $214_{a-b}$, a pair of NMOS transistors (M$_1$-M$_2$) $212_{a-b}$, an input transistor M$_5$ 126, a current control transistor M$_6$ 128, a tuning voltage 122, a pair of blocking capacitors $120_{a-b}$, a pair of resistors $118_{a-b}$, varactors $116_{a-b}$, a supply voltage V$_{dd}$ 109 and/or an inductor 124. In one or more embodiments, the oscillator circuit 100 may include a cross coupled negative $g_m$ transistor pair circuit 106, a tuning circuit 104 and/or an injection circuit 102.

In one or more embodiments, the oscillator circuit 100 may be an injection locked oscillator circuit. The oscillator circuit 100 may be referred to as injection locked oscillator circuit hereafter. In one or more embodiments, the injection circuit 102 of the oscillator circuit 100 may include an input transistor M$_5$ 126. In one or more embodiments, the transistor M$_5$ may acts as the input stage where the reference signal is applied. The injection circuit 102 of the injection locked oscillator circuit 100 may be configured to receive a reference signal as an input to the injection locked oscillator circuit 100. The power of the output signal that the injection locked oscillator circuit 100 generates may be higher than the power of the reference signal and/or power of the reduced frequency reference signal (not shown in FIG. 1). In one or more embodiments, the gate of input transistor M5 126 may receive the reference signal. In the embodiments of FIG. 1, the transistor M5 is an NMOS transistor. The drain of transistor M5 126 may be coupled to the sources of NMOS transistor pair M1 $112_a$ and M5 $112_b$ which are coupled together. The drains of transistor M1 $112_a$ and M5 $112_b$ may be coupled to the drain of PMOS transistor M4 $114_a$ and PMOS transistor M3 $114_b$ of the PMOS transistor pair forming the cross coupled $-g_m$ transistor pair respectively.

In some embodiments, input transistor M$_5$ 126 may be configured to operate as a transconductance amplifier, with an output current following the input voltage signal (e.g., reference signal). In one or more embodiments, transistor M$_5$ may be designed to have a high aspect ratio. The biasing of transistor M5 126 may be chosen to optimize the power-added efficiency (PAE) since it has an effect on the gain, drain efficiency, and/or output power. In one or more embodiments, since it is not preferred to have a short channel current source, a second device (e.g., current control transistor M$_6$ 128) may be added in series to control a tail current and/or vary the transmitted power. The current control transistor M$_6$ may be a long channel device. The current control transistor M$_6$ may be designed with a very large width. In one or more embodiments, the very large width may allow operating the circuit in voltage limited mode, by bypassing the very low on-resistance of transistor M$_6$ 128 when a high gate bias is applied. The injection circuit 102 may be coupled to the tuning circuit 104 and/or cross coupled negative $g_m$ differential pair circuit 106.

In one or more embodiments, the cross coupled negative $g_m$ transistor pair circuit 106 may include transistors M$_1$-M$_4$. In some embodiments, transistors M$_1$-M$_2$ $112_{a-b}$ may be a NMOS transistor pair and $M_3$-$M_4$ $114_{a-b}$ may be a PMOS transistor pair. In one or more embodiments, the sizes of these transistors are chosen based on a tradeoff between the requirements for output power, operating frequency and achievable power efficiency. The transconductances ($g_m$) of transistors $M_1$-$M_4$ are designed to overcome the losses in the tuning circuit 104 and/or the load in parallel with the tuning circuit that is coupled to the output of the injection locked oscillator circuit 100. In one or more embodiments, the transconductances may be represented through the following example equation 3:

$$g_m = \frac{1}{R_L} + \frac{1}{Q\rho} \quad (3)$$

The large $g_m$ values may justify the choice of complementary cross-coupled pair circuit topology, and for maximum efficiency, the transconductance of the two pairs may be targeted to be equal. In some embodiments, another condition for designing the cross-coupled pair is that oscillation onset of the circuit may be at a low supply voltage ($V_{DDonset}$).

In one or more embodiments, the tuning circuit 104 may be an LC-tank. The tuning circuit 104 may include an inductor $L_1$ 124 and a number of NMOS accumulation-mode varactors $C_V$ 116$_{a-b}$ with a variable capacitance. The varactors 116$_a$ and 116$_b$ may include a number of varactors in parallel. In one or more embodiments, increasing the number of varactors arranged in parallel may provide a wider tuning range. In one or more embodiments, a wide tuning range may allow for a wide locking range. The injection locked oscillator circuit 100 may be tuned as close as possible to the frequency of the reference signal (e.g., input signal) to reduce an power of the reference signal (e.g., input signal) required to lock the frequency of the reference signal to the inherent frequency of oscillation of the injection locked oscillator circuit 100.

In one or more embodiments, the tuning circuit 104 may be configured to lock an inherent frequency of oscillation of the injection locked oscillator circuit 100 to a frequency of the reference signal inputted to the injection locked oscillator circuit 100 based on the power of the reference signal inputted to the injection locked oscillator circuit 100. The frequency of the reference signal inputted to the injection locked oscillator circuit 100 may be higher than the inherent frequency of oscillation of the injection locked oscillator circuit 100. The reference signal may be amplified through locking the inherent frequency of oscillation of the injection locked oscillator circuit 100 to the frequency of the reference signal inputted to the injection locked oscillator circuit 100 (e.g., mode-locking) based on the power of the reference signal inputted to the injection locked oscillator circuit 100 that is lower than the power of the output signal. The output signal may correspond to the output signal.

The design of the inductor may depend on a desired frequency of oscillation ($f_{osc}$) and an output load ($R_L$) (not shown in FIG. 1). In some embodiments, the load may be a differential transmission antenna. The characteristic impedance ($\rho$) of the LC-tank may be at the most half of the load resistance to maintain the quality factor of the LC-tank after loading it. The load seen by the LC tank may be $2R_L$ since the output is differential. The following design conditions may be considered:

$$\rho = \sqrt{\frac{L}{C}} \leq \frac{1}{2}(2R_L), f_{osc} = \frac{1}{2\pi\sqrt{LC}} \quad (1)$$

The ratio of the following example equations may provide an upper limit for inductance $L_1$ 124.

$$\frac{\rho}{f_{osc}} = 2\pi L \leq \frac{R_L}{f_{osc}} \quad (2)$$

The capacitance C may be calculated based on example Equation 1. In one or more embodiments, the blocking capacitors $C_b$ 120$_{a-b}$ and resistors R 118$_{a-b}$ may provide the DC biasing of the varactors 116$_{a-b}$ respectively.

In one or more embodiments, the input drive that is needed to achieve locking for a certain lock range ($\Delta\omega$) may be obtained from the following condition shown in example equation 4, which requires that the excess phase introduced in the loop at $\omega=\omega_{osc}$ be zero.

$$\left|\frac{\Delta\omega}{\omega_{osc}}\right| = \left|\frac{H_0 a_2 V_{in}}{2Q}\right|$$

where $\omega_{osc}$ is the tank resonant frequency (e.g., LC tank of the tuning circuit 104), $H_0$ is $H(\omega_{osc})$ and $H(\omega)$ being a function that models the frequency selective LC tank, and $a_2$ is the second-order coefficient of a third-order nonlinear function ($f(e)=a_0+a_1e+a_2e_2+a_3e_3$) used to model the nonlinear behavior of a divide by 2 oscillator. From example equation 4, it may be seen that the lock range may be increased either by increasing $L_1$ or the input drive. Increasing the inductance however, may cause the phase condition (example equation 4) to fail since the resonance frequency may also increases.

Figure 2:
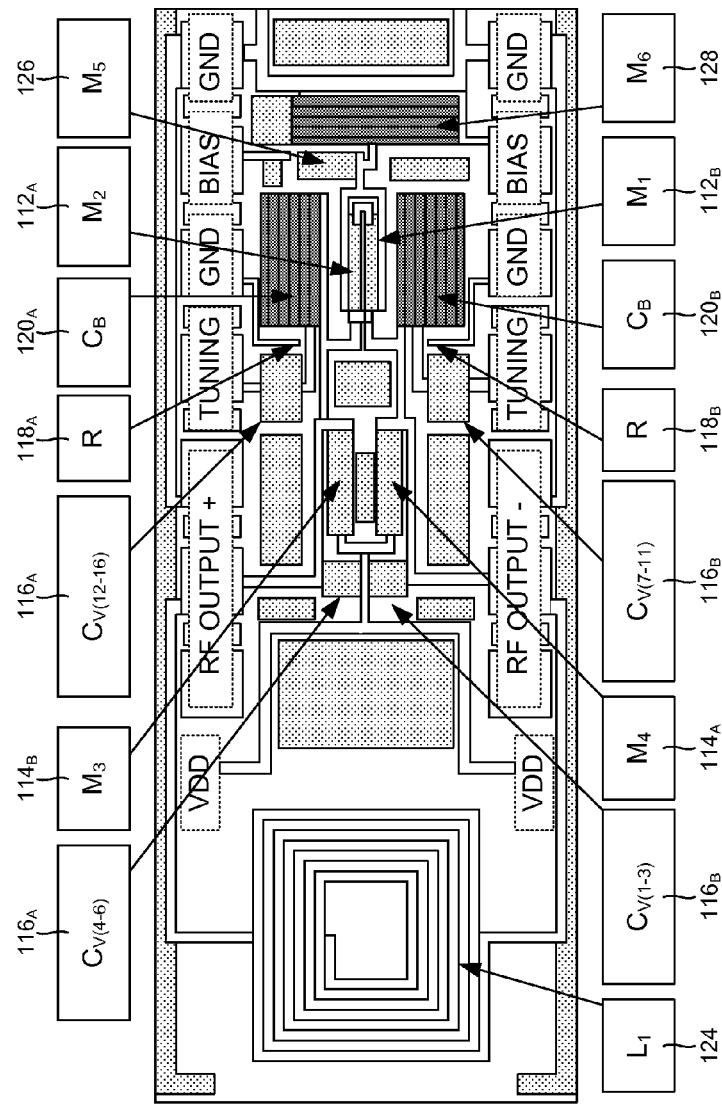
FIG. 2 is a photomicrograph view of the fabricated injection locked oscillator circuit of FIG. 1 configured to operate as a power amplifier on a standard CMOS technology, according to one or more embodiments.

FIG. 2 is a photomicrograph view of the fabricated injection locked oscillator circuit of FIG. 1 configured to operate as a power amplifier on a standard CMOS technology, according to one or more embodiments. In the embodiment of FIG. 2, the injection locked oscillator circuit 100 may be implemented on a 0.18 μm CMOS technology. In certain embodiments, the injection locked oscillator circuit may be implemented on a CMOS technology of a different length. In another embodiment, the injection locked oscillator circuit may be implemented on other semiconductor technologies as well. In one or more embodiments, all the components of the injection locked oscillator circuit 100 may be fully integrated. In some embodiments, the injection locked oscillator circuit 100 of the embodiment of FIG. 2 may be configured to operate at 433 MHz frequency. In another embodiment, the injection locked oscillator circuit 100 may be configured to operate at 2.4 GHz. The injection locked oscillator circuit 100 may occupy an area of 0.9 mm$^2$ when the injection locked oscillator circuit 100 may be configured to operate at 433 MHz with all the components of the injection locked oscillator circuit 100 being fully integrated. In another embodiment, the injection locked oscillator circuit 100 may occupy an area of 0.6 mm$^2$ when the injection locked oscillator circuit 100 may be configured to operate at 2.4 GHz. In one or more embodiments, the inductor $L_1$ 124, RF contact pads and/or all the major interconnections of the injection locked oscillator circuit 100 may be laid out using a top metal layer to minimize parasitic effects.

Figure 3:
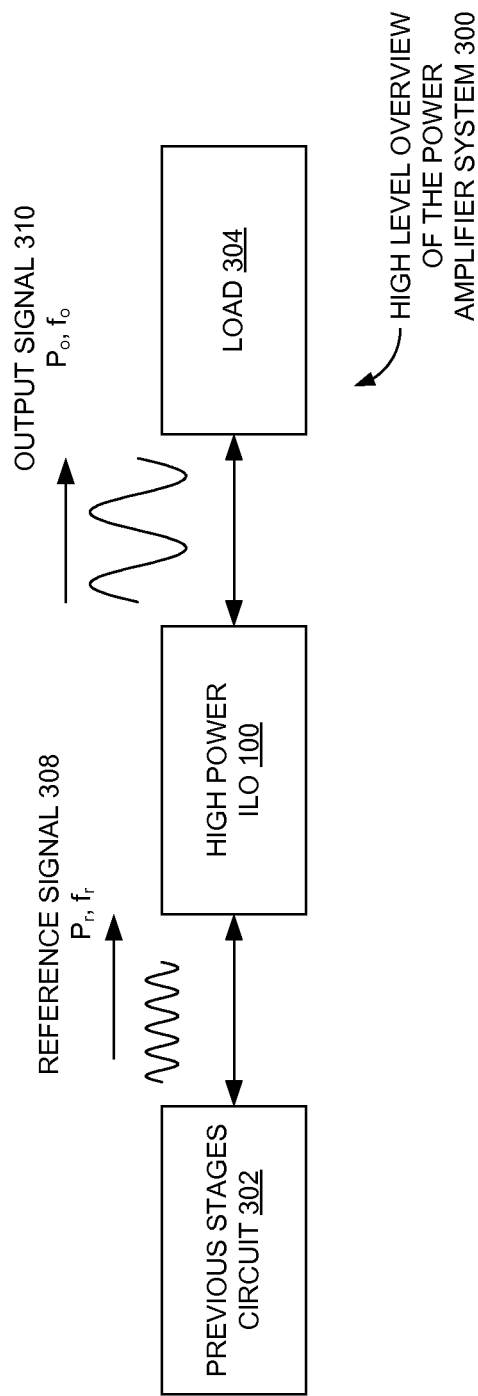
FIG. 3 is a system view of the oscillator circuit configured to operate as a power amplifier, according to one or more embodiments.

FIG. 3 is a system view of the injection locked oscillator circuit configured to operate as a power amplifier, according to one or more embodiments. In particular, FIG. 3 illustrates a circuit of a previous stage 302, an injection locked oscillator circuit 100, a reference signal 308, an output signal 310 and/or a load 304. In one or more embodiments, the injection locked oscillator circuit 100 may be a superharmonic injection locked oscillator circuit. In some embodiments, the superharmonic injection locked oscillator circuit may use frequency division to realize power amplification to allow a low-power power amplifier to be implemented in a small area and/or to achieve good performance in the sub-GHz range. In one or more embodiments, the power amplifier system may be an RF power amplifier. The power amplifier system may have multiple stages of operation. For example, many applications such as high intensity focused ultrasound biomedical application may require frequency synthesis and phase shifting stages. In digital phase shifting techniques, a signal may undergo several frequency conversions before transmission. The injection locked oscillator circuit 100 of FIG. 1 configured to operate as a power amplifier may be used as a last frequency-division stage in the aforementioned example. In one or more embodiments, the circuit of the previous stage 302 of operation of the injection locked oscillator circuit 100 may be coupled to the injection circuit 102 of the injection locked oscillator circuit 100. In one or more embodiments, the oscillator circuit may generate an output signal of frequency approximately equal to the desired output frequency $f_o$. In one or more embodiments, the circuit of the previous stage 302 may be a circuit of one of the RF stages of the power amplifier system from which the injection locked oscillator circuit 100 receives the input signal (e.g., reference signal 308). In the embodiment of FIG. 3, the reference signal 308 may have a frequency $f_r$ and power of the reference signal may be represented as $P_r$.

In one or more embodiments, the frequency of the reference signal 308 $f_r$ (e.g., input signal) may be reduced (e.g., frequency division) by half (e.g., fr/2) through the differential transistor pair of the injection locked oscillator circuit 100. Dividing the reference signal by 2 may reduce an input power required to lock the frequency of the reference signal to the inherent frequency of the injection locked oscillator circuit (e.g., mode-locking). In response to dividing the frequency of the reference signal by 2, a frequency of operation of a circuit of a previous stage 302 may be doubled. Increasing the frequency of operation of the circuit of the previous stage 302 may reduce an area occupied by the circuit (e.g., VCO and/or phase modulators). The frequency of operation of the circuit of the previous stage 302 may be increased without increasing a power consumption in that stage since the power of the input signal (e.g., reference signal) delivered from the circuit of the previous stage 302 to the injection locked oscillator circuit 100 may be low.

In some embodiments, the frequency of the output signal of the oscillator circuit may be approximately equal to the half the frequency of the reference signal 308. The frequency of the output signal 310 may be locked to the reduced frequency $f_r/2$ of the reference signal so that the output signal follows the reduced frequency of the reference signal. In certain embodiments, the frequency of the output signal 310 may be locked to the reduced frequency $f_r/2$ of the reference signal so that the frequency of the reference signal 308 may be two times that of the frequency of the output signal 310. The output signal 310 in the embodiment of FIG. 3, may be the output signal when the frequency of the output signal of the oscillator circuit is locked to the reduced frequency $f_r/2$ of the reference signal. In the embodiment of FIG. 3, $f_o$ may be lower than the frequency of the reference signal $f_r$. The frequency of the reference signal 308 may be twice the frequency of the output signal 310. In the embodiment of FIG. 3, the signal referred to as output signal 310 is the signal that is locked to the reduced frequency of the reference signal 308. The output signal (not the same of output signal 310) generated through the oscillator circuit 100 when the reference signal is not applied may be approximately equal to the frequency of the output signal 310 $f_o$.

The injection locked oscillator circuit 100 may require an input signal of very low power to lock the frequency of the reference signal to the inherent frequency of oscillation of the injection locked oscillator circuit 100. In one or more embodiments, the injection locked oscillator circuit 100 may be oscillating at an inherent frequency of oscillation of the injection locked oscillator circuit 100 before the reference signal is injected to the injection locked oscillator circuit 100. The reference signal may be amplified through the injection locked oscillator circuit 100. The reference signal may be amplified through locking the inherent frequency of oscillation of the injection locked oscillator circuit 100 to the reduced frequency of the reference signal. The frequency of the output signal may correspond to the reduced frequency of the reference signal to which the frequency of the output signal is locked. The output signal may have a frequency that is half the frequency of the reference signal. The output signal may be outputted through the output circuit ($208_a$ and $208_b$) of the injection locked oscillator circuit 100. The output signal may be delivered to a load 304 coupled to the output of the injection locked oscillator circuit 100. In some embodiments, the load may be an antenna through which a signal may be transmitted.

For example, an injection locked oscillator circuit 100 may be configured to be generating an output signal even prior to applying the reference signal as an input. The frequency of the output signal may correspond to the inherent frequency of oscillation of the injection locked oscillator circuit 100. The frequency of the output signal and/or inherent frequency of oscillation of the oscillator circuit may be $f_{initial}$. In an example embodiment of a 2.4 GHz system, $f_{initial}$ is 2.39 GHz. Also the power of the output signal may be 'x'. The power 'x' of the output signal may be a high power. The power 'x' may be high compared to a reference signal that is applied as an input to the injection locked oscillator circuit 100. The desired frequency of the output signal to be transmitted may be based on the system or the application of the system. The desired frequency may be represented as $f_c$. In the example embodiment, $f_c$ is 2.4 GHz.

The reference signal inputted through the injection circuit of the oscillator circuit 100 may have a power 'y' and the frequency of the reference signal is configured to be two times the desired frequency at which the input signal is desired to be transmitted which is $2f_c$. In the example embodiment, the frequency of the reference signal inputted through the injection circuit may be 4.8 GHz since the frequency at which the signal is desired to be transmitted is 2.4 GHz. The power 'y' of the reference signal may be lower than the power 'x' of the output signal.

The reference signal may get reduced by half through the differential transistor pair of the injection locked oscillator circuit 100. The frequency of the reference signal $2f_c$ may be $f_c$ when the frequency of the reference signal is reduced by half. The tuning circuit may lock the frequency of the output signal and/or inherent frequency $f_{initial}$ of the injection locked oscillator circuit 100 to the reduced frequency $f_c$ of the reference signal. The frequency of the output signal $f_{initial}$ may correspond to the reduced frequency $f_c$ of the reference signal through locking the frequency of the output signal $f_{initial}$ to the reduced frequency $f_c$ of the reference signal. In the example embodiment, after injection locking the frequency of the output signal is 2.4 GHz.

The closer the inherent frequency $f_{initial}$ (2.39 GHz) of the injection locked oscillator circuit 100 is tuned to match the reduced frequency $f_c$ (2.4 GHz) of the reference signal, the lesser the power of the reference signal 'y' may be required to lock the signal. The power of the reference signal 'y' is lower than the power of the output signal 'x' through which the injection locked oscillator circuit may operate as a power amplifier. The ratio of output power 'x' to reference signal power 'y' may determine the gain of the power amplifier. The gain of the amplifier may be increased through reducing a power 'y' of the input signal and/or by configuring the oscillator to generate an output signal of higher power 'x'. The power of the reference signal 'y' to lock the inherent frequency of oscillation to the reduced frequency of the reference signal may be low since there already exists an output signal of high power while the reference signal is inputted to the injection locked oscillator circuit 100.

FIG. 4 is a table view of a performance comparison between the injection locked oscillator circuit of FIG. 1 configured to operate as a power amplifier and various power amplifiers, according to one or more embodiments. In particular FIG. 4, illustrates a power amplifier (PA) class 402, frequency (f) 404, a DC power ($P_{DC}$) 406, an output power ($P_{out}$) 408, a gain 410, a power added efficiency (PAE) 412 and a chip area occupied by the circuit (Area) 414.

In one or more embodiments, the table in FIG. 4 shows a comparison between various power amplifiers targeting a low power application in comparison to the injection locked power amplifier of FIG. 1. The references compared were selected based on ISM-band operating frequencies and low output power levels that may be suitable for short-range applications such as wireless sensor networks or biomedical implantable electronic circuits. A 433 MHz design of the injection locked oscillator circuit 100 configured to operate as a power amplifier of FIG. 1 shown in the fourth row of the table achieves comparable performance to the other designs. Even though it is fully integrated, it consumes the same area and achieves much higher gain of 30 dB. The 2.4 GHz design of the injection locked oscillator circuit 100 configured to operate as a power amplifier of FIG. 1 shown in the last row of the table also achieves a much higher gain of 31 dB and/or a PAE of 36% from a very small chip area of 0.6 mm², eliminating the need for a PA driver stage.

Figure 5:
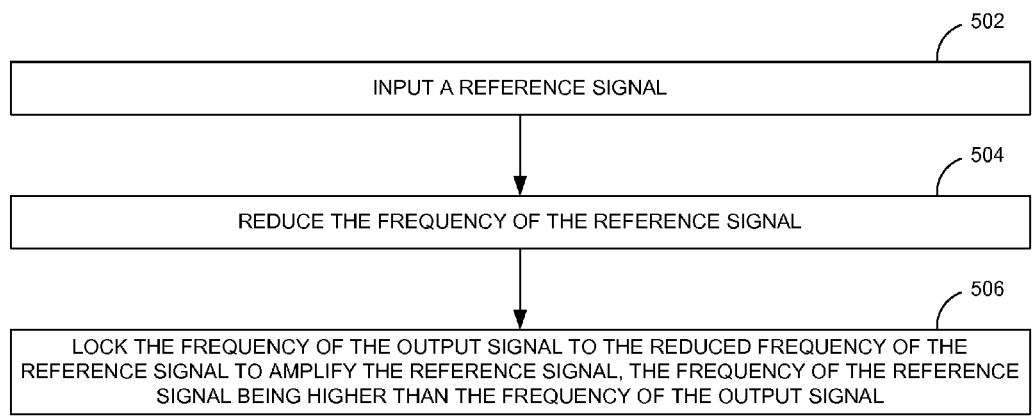
FIG. 5 is a process flow diagram illustrating the operation of the injection locked oscillator circuit of FIG. 1, according to one or more embodiments.

FIG. 5 is a process flow diagram illustrating the operation of the injection locked oscillator circuit of FIG. 1, according to one or more embodiments. In one or more embodiments, in operation 502 a reference signal 308 may be inputted to the oscillator circuit (e.g., injection locked oscillator circuit) through an injection circuit of an oscillator circuit that generates an output signal 310 of high power that oscillates at an inherent frequency of oscillation of the oscillator circuit. The power of the output signal 310 may be higher than a power of the reference signal 308. In operation 504, a frequency of the reference signal 308 may be reduced through a differential transistor pair coupled to the injection circuit of the oscillator circuit. In operation 506, a frequency of the output signal 310 may be locked to the reduced frequency of the reference signal 308 through a tuning circuit of the oscillator circuit coupled to the differential transistor pair based on the power of the reference signal to amplify the power of the reference signal 308 through the oscillator circuit. The frequency of the reference signal 308 may be higher than the frequency of the output signal 310.

Figure 6:
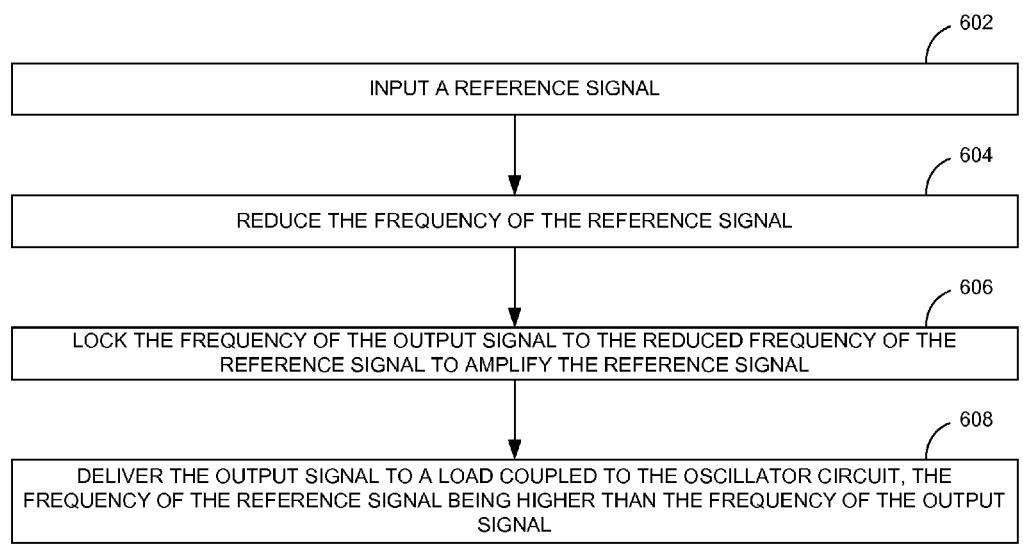
FIG. 6 is a process flow diagram illustrating operation of the injection locked power amplifier coupled to a load, according to one or more embodiments.

FIG. 6 is a process flow diagram illustrating operation of the injection locked power amplifier coupled to a load, according to one or more embodiments. In one or more embodiments, in operation 602 a reference signal may be inputted to the oscillator circuit (e.g., injection locked oscillator circuit) through an injection circuit of an oscillator circuit that generates an output signal of high power that oscillates at an inherent frequency of oscillation of the oscillator circuit. The power of the output signal may be higher than a power of the reference signal. In operation 604, a frequency of the reference signal may be reduced through a differential transistor pair coupled to the injection circuit of the oscillator circuit. In operation 606, a frequency of the output signal may be locked to the reduced frequency of the reference signal through a tuning circuit of the oscillator circuit coupled to the differential transistor pair based on the power of the reference signal to amplify the power of the reference signal through the oscillator circuit. The frequency of the reference signal may be higher than the frequency of the output signal. In one or more embodiments, in operation 608, the output signal may be delivered to a load coupled to an output circuit of the oscillator circuit. The power of the output signal is based on a difference between a power of the output signal and the power of the reference signal required to maintain the locking of the reduced frequency of the reference signal to the frequency of the output signal.

In one or more embodiments, the oscillator circuit may be configured to operate as a power amplifier through locking the frequency of the output signal to the reduced frequency of the reference signal to amplify the power of the reference signal. The power of the reference signal and/or the power of the reference signal of reduced frequency may be lower than the power of the output signal. In one or more embodiments, the power of the reference signal may be amplified through locking the frequency of the output signal to the reduced frequency of the reference signal based on the power of the reference signal. In one or more embodiments, the locking of the frequency of the output signal to the reduced frequency of the reference signal may further include locking the inherent frequency of oscillation of the oscillator circuit to the reduced frequency of the reference signal. The inherent frequency of oscillation of the oscillator circuit may be equivalent to the frequency of oscillation of the output signal. The frequency of the output signal and/or the inherent frequency of oscillation of the oscillator circuit may correspond to the reduced frequency of the reference signal when the inherent frequency of oscillation of the oscillator circuit is locked to the reduced frequency of the reference signal.

Although the present embodiments have been described with reference to specific example embodiments, it will be evident that various modifications and changes may be made to these embodiments without departing from the broader spirit and scope of the various embodiments. For example, the various devices and modules described herein may be enabled and operated using hardware, firmware and software (e.g., embodied in a machine readable medium). For example, the various electrical structure and methods may be embodied using transistors, logic gates, and electrical circuits (e.g., application specific integrated (ASIC) circuitry and/or in digital signal processor (DSP) circuitry).

In addition, it will be appreciated that the various operations, processes, and methods disclosed herein may be embodied in a machine-readable medium and/or a machine accessible medium compatible with a data processing system (e.g., a computer devices), may be performed in any order (e.g., including using means for achieving the various operations). Accordingly, the specification and drawings are to be regarded in an illustrative rather than a restrictive sense.

We claim:

1. A method comprising:
inputting a reference signal through an injection circuit of an oscillator circuit that generates an output signal configured to oscillate at an inherent frequency of oscillation thereof, a power of the output signal being higher than a power of the reference signal;
dividing a frequency of the reference signal through a differential transistor pair coupled to the injection circuit of the oscillator circuit;
providing a capability to decrease an area of a circuit comprising the oscillator circuit through doubling an operating frequency of a previous stage of the oscillator circuit in accordance with the division of the frequency of the reference signal;
locking, through a tuning circuit of the oscillator circuit coupled to the differential transistor pair, a frequency of the output signal to the divided frequency of the reference signal based on the power of the reference signal to amplify the power of the reference signal through the oscillator circuit, the frequency of the reference signal being higher than the frequency of the output signal, and the locking being based on superharmonic injection-locking, thereby enabling use of the frequency division based superharmonic injection-locked oscillator circuit as a power amplifier outputting a power of less than 10 dBm and providing a gain of around 30 dB;
choosing sizes of transistors of the differential transistor pair based on a tradeoff between requirements for an output power of the power amplifier, an operating frequency thereof and an achievable power efficiency;
designing transconductances of the transistors to overcome losses in at least one of: the tuning circuit and a load in parallel therewith that is coupled to an output of the oscillator circuit; and
fully integrating components of the frequency division based superharmonic injection-locked oscillator circuit within a circuit chip.

2. The method of claim 1, further comprising:
delivering the output signal to the load coupled to the output of the oscillator circuit, a gain of the power amplifier being based on a difference between a power of the output signal and the power of the reference signal required to maintain the locking of the divided frequency of the reference signal to the frequency of the output signal.

3. The method of claim 1, wherein locking the frequency of the output signal to the divided frequency of the reference signal further comprises:
selecting the inherent frequency of oscillation of the oscillator circuit as equivalent to a frequency of oscillation of the output signal, at least one of the frequency of the output signal and the inherent frequency of oscillation of the oscillator circuit being configured to correspond to the divided frequency of the reference signal when the inherent frequency of oscillation of the oscillator circuit is locked to the divided frequency of the reference signal.

4. The method of claim 1, further comprising:
reducing the power of the reference signal to lock the frequency of the output signal to the divided frequency of the reference signal through tuning the oscillator circuit to operate at a frequency equivalent to a desired frequency of output signal.

5. The method of claim 1, further comprising:
driving the oscillator circuit based on the power of the reference signal that is lower than the power of the output signal through injection locking between the reference signal and the output signal through the oscillator circuit.

6. The method of claim 1, further comprising:
locking the frequency of the output signal to the divided frequency of the reference signal when at least one of:
the divided frequency of the reference signal is within a tuning range of the oscillator circuit and the divided frequency reference signal has sufficient power to drive the oscillator circuit configured to operate as the power amplifier.

7. The method of claim 1, comprising utilizing a cross-coupled transconductance transistor pair as the differential transistor pair.

8. A power amplifier comprising:
a circuit stage; and
an oscillator circuit coupled to the circuit stage, the oscillator circuit being configured to generate an output signal configured to oscillate at an inherent frequency of oscillation thereof, the oscillator circuit comprising:
an injection circuit configured to receive a reference signal from the circuit stage as an input to the oscillator circuit, a power of the output signal being higher than a power of the reference signal;
a differential transistor pair coupled to the injection circuit to divide a frequency of the reference signal; and
a tuning circuit coupled to the differential transistor pair to lock a frequency of the output signal to the divided frequency of the reference signal based on the power of the reference signal to amplify the power of the reference signal through the oscillator circuit, the frequency of the reference signal being higher than the frequency of the output signal, and the locking being based on superharmonic injection-locking, thereby enabling use of the frequency division based superharmonic injection-locked oscillator circuit as the power amplifier outputting a power of less than 10 dBm and providing a gain of around 30 dB,
wherein sizes of transistors of the differential transistor pair are based on a tradeoff between requirements for an output power of the power amplifier, an operating frequency thereof and an achievable power efficiency,
wherein transconductances of the transistors are designed to overcome losses in at least one of: the tuning circuit and a load in parallel therewith that is coupled to an output of the oscillator circuit,
wherein a capability to decrease an area of the power amplifier comprising the circuit stage and the oscillator circuit is provided through doubling an operating frequency of the circuit stage in accordance with the division of the frequency of the reference signal, and
wherein components of the power amplifier are fully integratable within a circuit chip.

9. The power amplifier of claim 8,
wherein a gain of the power amplifier is based on a difference between a power of the output signal and the power of the reference signal required to maintain the locking of the divided frequency of the reference signal to the frequency of the output signal.

10. The power amplifier of claim 8, wherein the tuning circuit is configured to lock the frequency of the output signal to the divided frequency of the reference signal based on:
selecting the inherent frequency of oscillation of the oscillator circuit as equivalent to a frequency of oscillation of the output signal, at least one of the frequency of the output signal and the inherent frequency of oscillation of the oscillator circuit being configured to correspond to the divided frequency of the reference signal when the inherent frequency of oscillation of the oscillator circuit is locked to the divided frequency of the reference signal.

11. The power amplifier of claim 8,
wherein the power of the reference signal is reduced to lock the frequency of the output signal to the divided frequency of the reference signal through tuning the oscillator circuit to operate at a frequency equivalent to a desired frequency of output signal.

12. The power amplifier of claim 8,
wherein the oscillator circuit is driven based on the power of the reference signal that is lower than the power of the output signal through injection locking between the reference signal and the output signal through the oscillator circuit.

13. The power amplifier of claim 8,
wherein the frequency of the output signal is locked to the divided frequency of the reference signal when at least one of: the divided frequency of the reference signal is within a tuning range of the oscillator circuit and the divided frequency reference signal has sufficient power to drive the oscillator circuit.

14. The power amplifier of claim 8, wherein the differential transistor pair is a cross-coupled transconductance transistor pair.

15. An oscillator circuit configured to operate as a power amplifier and to generate an output signal configured to oscillate at an inherent frequency of oscillation thereof, comprising:
an injection circuit configured to receive a reference signal from a previous circuit stage as an input to the oscillator circuit, a power of the output signal being higher than a power of the reference signal;
a differential transistor pair coupled to the injection circuit to divide a frequency of the reference signal; and
a tuning circuit coupled to the differential transistor pair to lock a frequency of the output signal to the divided frequency of the reference signal based on the power of the reference signal to amplify the power of the reference signal through the oscillator circuit, the frequency of the reference signal being higher than the frequency of the output signal, and the locking being based on superharmonic injection-locking, thereby enabling use of the frequency division based superharmonic injection-locked oscillator circuit as the power amplifier outputting a power of less than 10 dBm and providing a gain of around 30 dB,
wherein sizes of transistors of the differential transistor pair are based on a tradeoff between requirements for an output power of the power amplifier, an operating frequency thereof and an achievable power efficiency,
wherein transconductances of the transistors are designed to overcome losses in at least one of: the tuning circuit and a load in parallel therewith that is coupled to an output of the oscillator circuit,
wherein a capability to decrease an area of a circuit comprising the oscillator circuit is provided based on doubling an operating frequency of the previous circuit stage in accordance with the division of the frequency of the reference signal, and
wherein components of the power amplifier are fully integratable within a circuit chip.

16. The oscillator circuit of claim 15,
wherein a gain of the power amplifier is based on a difference between a power of the output signal and the power of the reference signal required to maintain the locking of the divided frequency of the reference signal to the frequency of the output signal.

17. The oscillator circuit of claim 15, wherein the tuning circuit is configured to lock the frequency of the output signal to the divided frequency of the reference signal based on:
selecting the inherent frequency of oscillation of the oscillator circuit as equivalent to a frequency of oscillation of the output signal, at least one of the frequency of the output signal and the inherent frequency of oscillation of the oscillator circuit being configured to correspond to the divided frequency of the reference signal when the inherent frequency of oscillation of the oscillator circuit is locked to the divided frequency of the reference signal.

18. The oscillator circuit of claim 15,
wherein the power of the reference signal is reduced to lock the frequency of the output signal to the divided frequency of the reference signal through tuning the oscillator circuit to operate at a frequency equivalent to a desired frequency of output signal.

19. The oscillator circuit of claim 15,
wherein the oscillator circuit is driven based on the power of the reference signal that is lower than the power of the output signal through injection locking between the reference signal and the output signal through the oscillator circuit.

20. The oscillator circuit of claim 15,
wherein the frequency of the output signal is locked to the divided frequency of the reference signal when at least one of: the divided frequency of the reference signal is within a tuning range of the oscillator circuit and the divided frequency reference signal has sufficient power to drive the oscillator circuit configured to operate as the power amplifier.

* * * * *